United States Patent
Zettler

(10) Patent No.: US 7,304,879 B2
(45) Date of Patent: Dec. 4, 2007

(54) NON-VOLATILE MEMORY ELEMENT CAPABLE OF STORING IRREVERSIBLE COMPLEMENTARY DATA

(75) Inventor: Thomas Zettler, Höhenkirchen-Siegertsbrunn (DE)

(73) Assignee: Infineon Technologies AG (DE)

(*) Notice: Subject to any disclaimer, the term of this patent is extended or adjusted under 35 U.S.C. 154(b) by 0 days.

(21) Appl. No.: 11/340,125

(22) Filed: Jan. 26, 2006

(65) Prior Publication Data

US 2006/0198213 A1    Sep. 7, 2006

Related U.S. Application Data

(63) Continuation of application No. PCT/DE2004/001437, filed on Jul. 5, 2004.

(30) Foreign Application Priority Data

Jul. 29, 2003   (DE) ................. 103 34 630

(51) Int. Cl.
    *G11C 17/12*   (2006.01)
(52) U.S. Cl. .............. 365/104; 365/96; 365/148; 365/189.05; 365/189.07; 365/190; 365/207; 365/225.7
(58) Field of Classification Search ............... 365/96, 365/104, 148, 190, 189.07, 189.05, 207, 365/225.7
    See application file for complete search history.

(56) References Cited

U.S. PATENT DOCUMENTS

| | | | |
|---|---|---|---|
| 4,170,741 A | 10/1979 | Williams | 327/55 |
| 4,592,025 A * | 5/1986 | Takemae et al. | 365/200 |
| 4,613,959 A | 9/1986 | Jiang | 365/200 |
| 4,703,455 A | 10/1987 | Bynum | 365/174 |
| 4,773,046 A | 9/1988 | Akaogi et al. | 714/718 |
| 5,148,391 A | 9/1992 | Zagar | 365/96 |

(Continued)

FOREIGN PATENT DOCUMENTS

DE    195 05 293 A1    8/1996

(Continued)

OTHER PUBLICATIONS

Mistry et al., How do Hot Carriers Degrade N-Channel MOSFETs?, IEEE Circuits and Devices, Bd. 11 Nr. 1 pp. 28-33, Jan. 1, 1995.

(Continued)

*Primary Examiner*—Andrew Q. Tran
(74) *Attorney, Agent, or Firm*—Dickstein, Shapiro, LLP.

(57) ABSTRACT

A non-volatile memory element for storing at least one data item, having a readable memory cell which can be written on with a first part of a data item, the memory cell exhibiting a first characteristic which is electrically irreversibly modifiable according to the first partial data item, at least one readable second memory cell which can be written on by a second partial data item, the second memory cell being electrically irreversibly modifiable according to the second partial data item, and a reader device which is coupled to the first memory cell and second memory cell. The memory element is configured such that the first partial data item and second partial data item are respectively determined according to the data item. The reader device is configured such that it determines the stored data item by comparing the first partial data item with the second partial data item.

19 Claims, 4 Drawing Sheets

U.S. PATENT DOCUMENTS

| | | | |
|---|---|---|---|
| 5,384,746 A * | 1/1995 | Giolma | 365/225.7 |
| 5,432,737 A | 7/1995 | Yoneda | 365/185.18 |
| 5,825,686 A | 10/1998 | Schmitt-Landsiedel et al. | 365/185.03 |
| 6,266,281 B1 | 7/2001 | Derhacobian et al. | 365/185.29 |
| 6,310,811 B1 | 10/2001 | Kohno | 365/210 |
| 6,346,738 B1 * | 2/2002 | Kim et al. | 257/529 |
| 6,430,101 B1 * | 8/2002 | Toda | 365/225.7 |
| 6,507,053 B1 | 1/2003 | Bernard et al. | 257/209 |
| 6,567,333 B2 | 5/2003 | Toda | 365/225.7 |
| 2002/0191468 A1 | 12/2002 | Toda | 365/225.7 |

FOREIGN PATENT DOCUMENTS

| | | |
|---|---|---|
| EP | 0 252 325 A2 | 1/1988 |
| JP | 2000-222896 | 8/2000 |
| JP | 3336985 | 8/2002 |
| WO | 2005/015567 | 2/2005 |

OTHER PUBLICATIONS

Quader et al., "A Bidirectional NMOSFET Current Reduction Model for Simulation of Hot-Carrier-Induced Circuit Degradation" IEEE Transactions on Electron Devices, Bd. 40 Nr. 12, pp. 2245-2254, Dec. 1993.

Shappir et al., "Spatial Characterization of Hot Carriers Injected into the Gate Dielectric Stack of a MOSFET based Non-Volatile memory Device" The 22nd Convention of Electrical and Electronics Engineers in ISrael, pp. 58-60, Dec. 2002.

Lusky et al., "Characterization of Channel Hot Electron Injection by the Subthreshold Slope of NROM(tm) Device", IEEE Electron Device Letters, vol. 22, No. 11, pp. 556-558, Nov. 2001.

Abstract of Dietrich Rhein/Heinz Freitag—Microeletronic Memories, ISBN 3-211-82354-9, Springer-Verlag, pp. 105-108 (Section 5.3), 1992.

Abstract of Dietrich Rhein/Heinz Freitag—Microelectronic Memories, ISBN 3-211-82354-9, Springer-Verlag, pp. 122-127 (Sections 5.5.2 and Chapter 5.6), 1992.

International Search Report Application No. PCT/DE2004/001437, 3 pages, mailed Dec. 9, 2004.

International Preliminary Report on Patentability; PCT/DE2004/001437; 6 pages, Jan. 30, 2006.

International Preliminary Report on Patentability, PCT/DE2004/001437, 8 pages, mailing Date Jun. 8, 2006.

* cited by examiner

NON-VOLATILE MEMORY ELEMENT CAPABLE OF STORING IRREVERSIBLE COMPLEMENTARY DATA

CROSS-REFERENCE TO RELATED APPLICATION

This application is a continuation of co-pending International Application No. PCT/DE2004/001437 filed Jul. 5, 2004 which designates the United States, and claims priority to German application number DE 103 34 630.9 filed Jul. 29, 2003, which are incorporated herein by reference in their entirety.

TECHNICAL FIELD

The present invention relates to a memory element for the non-volatile storage of at least one datum.

BACKGROUND

The non-volatile storage of data or states is often necessary in integrated semiconductor circuits. Non-volatile memories are suitable in particular for holding small to medium volumes of data, such as, by way of example, redundancy data, data keys and self-test results. These can thus be repeatedly made available to the user.

A number of non-volatile memory elements are known to the person skilled in the art. As an example thereof, mention shall be made of the textbook "Mikroelektronische Speicher" ["Microelectronic Memories"] by Dietrich Rhein and Heinz Freitag, ISBN 3 211 82354 3, in particular pages 105 to 108 and pages 122 to 127. Non-volatile memories include electrically programmable read-only memories or EPROMs, and flash memories with floating gate technologies. Ferroelectric and magnetic read/write memories are also known. These memories have the disadvantage in common that complicated process steps are needed during their fabrication, which lead to higher product costs.

Another form of non-volatile memories uses severable interconnects in the integrated semiconductor circuit, so-called "fuses". Writing to such memories requires separate devices such as, by way of example, laser cutters or means for generating high currents. It is thus not always possible for the users of such memories themselves to write to the memory. This may be a disadvantage particularly when such memories are used in mobile systems.

What is more, severable fuses entail the risk of separated connections at least partly growing together again during operation. As a result, data stored in the memory may be corrupted without this being perceptible to the user.

SUMMARY

The present invention is based on the problem of providing a cost-effective memory element and a memory element arrangement enabling non-volatile storage of data in a simple and reliable manner.

The problem can be solved by means of a non-volatile memory element for storing at least one datum that has at least one first memory cell to which and from which a first partial datum can be written and read out and which has a first characteristic that can be altered electrically irreversibly in a manner dependent on the first partial datum, at least one second memory cell to which and from which a second partial datum can be written and read out and which has a second characteristic that can be altered electrically irreversibly in a manner dependent on the second partial datum, and a read device coupled to the first memory cell and the second memory cell, the memory element being set up in such a way that the first partial datum and the second partial datum are in each case determined in a manner dependent on the datum, and the read device being set up in such a way that it determines the stored datum from a comparison of the first partial datum with the second partial datum.

The second partial datum can be the complementary value of the first partial datum, and the read device can be set up in such a way that it determines the datum stored in the memory element from the difference between the first partial datum and the second partial datum. The read device may comprise a differential amplifier for determining the datum from the first partial datum and the second partial datum. The first memory cell and/or the second memory cell each may comprise a resistance element, and the first and/or second characteristic can be the electrical conductivity of the resistance element. The resistance element can be an electrically severable interconnect. The first memory cell and/or the second memory cell each may comprise a transistor and the first and/or second characteristic can be the saturation current of a source-drain path of the transistor. A memory element may further comprise a register coupled to the read device and serving for storing the datum determined by the read device. The first memory cell and/or the second memory cell may comprise a switching element, which prevents or permits an electric current flow through the first memory cell in a manner dependent on an activation signal fed to the switching element. A memory element arrangement may comprise a multiplicity of such non-volatile memory elements, and may comprise a selection device coupled to the multiplicity of non-volatile memory elements, wherein the selection device is set up in such a way that a datum can selectively be stored in a memory element selected from the multiplicity of memory elements or be read out from the said memory element. The multiplicity of memory elements may comprise a common read device.

One fundamental idea of the invention consists in redundant storage of the datum. In the memory element, the first partial datum is stored in the first memory cell and the second partial datum is stored in the second memory cell by irreversibly altering the electrically alterable characteristic of the first memory cell and of the second memory cell, respectively. Such a characteristic may be a physically measurable parameter whose value is changed irreversibly in a manner dependent on the respective partial datum. This may take place by means of a degradation of a physical quantity such as a conductivity, for example. To express it clearly, the invention is thus also based on the utilization of irreversible degradation operations in the memory circuit, more precisely in the first memory cell and/or in the second memory cell.

The first partial datum and also the second partial datum are defined in a manner dependent on the datum to be stored. By way of example, the first partial datum and the second partial datum may correspond in terms of their value to the datum to be stored. However, the first partial datum and/or the second partial datum may also correspond to the complementary value of the datum to be stored.

When the datum is read out from the memory element, this is determined by a read device from a comparison between the first partial datum and the second partial datum. This arrangement advantageously ensures a secure read-out of the datum stored in the memory element. If the first partial datum is no longer able to be reliably determined, for example as a result of uncontrollable physical processes, then the comparison with the second partial datum provides for a secure indication of the stored datum.

The memory element arrangement has a multiplicity of memory elements according to the invention having a selection device coupled to the multiplicity of memory elements, which selection device is set up in such a way that a datum can selectively be stored in a memory element selected from the multiplicity of memory elements or be read out from the said memory element.

Thus, a further basic concept of the present invention consists in a memory element arrangement with a multiplicity of the non-volatile memory elements already mentioned. By means of the selection device, it is possible for a plurality of data to be stored in a respective memory element. In the example of a binary system, a bit is thus in each case stored in a memory element. Greater volumes of data can thus advantageously be stored.

It is possible to realize the memory element arrangement in an arrangement comprising a plurality of components for example by each memory element and the driving device being embodied in a dedicated component. However, the memory element arrangement may also be embodied in a single semiconductor circuit which can advantageously be fabricated with the aid of a submicron CMOS process.

In a preferred development, the second partial datum is the complementary value of the first partial datum. In this case, the read device is set up in such a way that the stored datum is determined from the difference between the first partial datum and the second partial datum.

What is advantageous here, in particular, is that the first partial datum and the second partial datum are stored by means of different states of the alterable characteristic. Interference or undesirable external influences thus influence the stored partial data to different extents.

Preferably, in this development, the read device for determining the datum from the first partial datum and the second partial datum is embodied in the form of a differential amplifier. This embodiment permits a cost-effective and simple realization.

In one embodiment of the invention, the first characteristic and/or the second characteristic is the conductivity of a resistance element. This may take place by virtue of the fact that the conductivity can be irreversibly altered by influencing the charge carrier zone in a manner dependent on a partial datum to be stored. Such influencing of the charge carrier zone may be caused for example by hot carrier effects. One advantage of this arrangement is that it can readily be fabricated in a customary semiconductor process, such as in CMOS, for example.

In a preferred development, the resistance element comprises an electrically severable interconnect, a so-called fuse track, which can be destroyed in a manner dependent on a partial datum to be stored. This destruction quite generally takes place as a result of electromigration. A further cause may be melting of the fuse track as a result of thermal effects of an electric current. The distinctly measurable difference between the resistance values before and after storage of a partial datum is advantageous here. If a fuse track is severed, then its conductivity falls to the value zero.

In a further embodiment, the first memory cell and/or the second memory cell in each case have at least one transistor. A saturation current of the transistor can be degraded in a manner dependent on a partial datum to be stored. This degradation of the saturation current takes place as a result of hot carrier effects at the gate oxide of the transistor. The charge carrier channel of the transistor is thus influenced in such a way that the charge carrier flow is restricted. Preferably, during a writing operation, a current flows through the resistance element in a different direction than during a reading operation. Due to the asymmetry of the damage, the distribution of an electric field in the transistor will likewise turn out to be asymmetrical. This amplifies the degradation of the saturation current which, in the event of a read-out of the stored value, flows in the opposite direction to the current when writing the datum. The cause of this effect is based on the effective screening of the charge carrier channel in the transistor by the damage of the gate oxide and the lack of support of the channel flow in the region of the damage by the additional field of the drain terminal. The degradation is thus particularly pronounced if the current which damages the gate oxide flows in a different direction than the current during a measurement of the saturation current.

In a further preferred development, the memory element according to the invention has a register coupled to the read device and serving for securing the datum determined by the read device. In this case, a data output of the read device is connected to the input of a register. This advantageously reduces the number of accesses to the memory cell to a minimum. The data have to be transferred from the memory cell into the register only when a corresponding value is not present there. The small number of accesses to the memory cell enables a further degradation thereof to be prevented as far as possible.

In an alternative development, the first memory cell and/or the second memory cell have a switching element, which prevents or permits a current flow through the respective element in a manner dependent on an activation signal fed to the switching element. Consequently, an unnecessary influencing of degradation of the alterable characteristic may likewise be prevented. A current advantageously flows only if a partial datum is written to the respective memory cell, or if the datum is determined by the read device.

In a development of the control element arrangement, the multiplicity of memory elements have a common read device, so that unnecessary chip area that causes costs can be saved in an embodiment as an integrated semiconductor circuit.

BRIEF DESCRIPTION OF THE DRAWINGS

The invention is explained in more detail below using a plurality of exemplary embodiments with reference to the drawing, in which.

DETAILED DESCRIPTION

Figure 1:
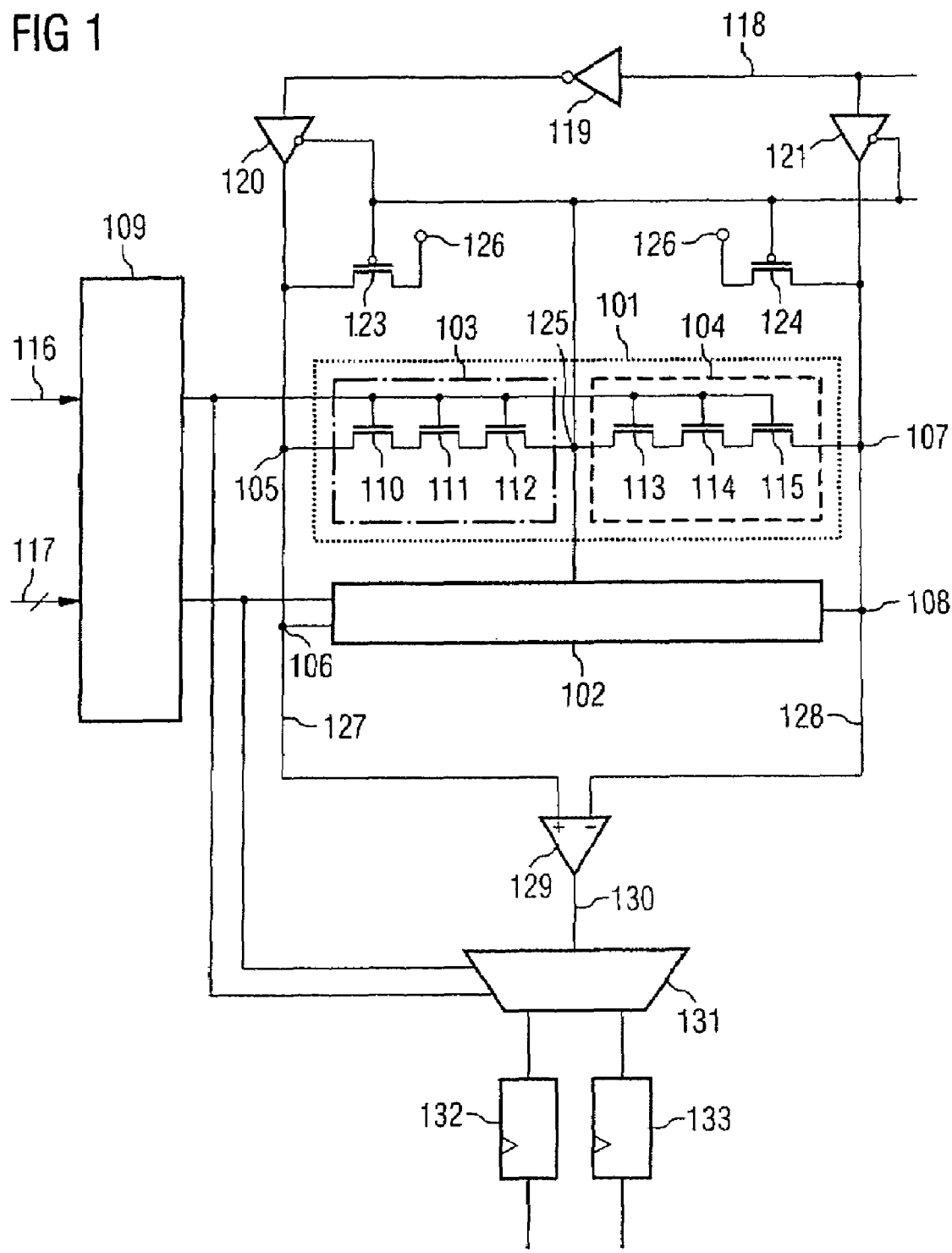
FIG. 1 shows a memory element in accordance with a first exemplary embodiment of the invention, in which the degradation of the saturation current of a transistor is utilized for storing data.

FIG. 1 shows the circuit construction of a memory element in which the degradation of the saturation current of a transistor is utilized for storing data. The memory element has a first memory cell group 101 (illustrated in dotted fashion), which in each case has a first memory cell 103 (illustrated in dashed fashion) with a first signal connection 105 and a second memory cell 104 (illustrated in dashed fashion) with a second signal connection 107. A second memory cell group 102 is illustrated as a circuit block with a first signal connection 106 and a second signal connection 108. Its internal construction is equivalent to that of the memory cell group 101. It is possible to provide as many additional further memory cell groups as desired in each case having any desired number of transistors in the memory cells.

The first memory cell 103 and the second memory cell 104 respectively comprise a plurality of transistors 110, 111, 112 and 113, 114, 115, the source-drain paths of which are connected in series. A respective signal path via the series circuit of this source-drain path in the first memory cell 103 or in the second memory cell 104 connects the first signal connection 105 to a control connection 125.

The gate terminals of the transistors 110, 111, 112 and 113, 114, 115 receive an access control signal from an access control output of a decoder 109 via a cell selection line. In this case, the memory cell group 101, 102 is assigned a respective access control output of the decoder 109. The decoder 109 additionally has a first input for an activation signal 116 and a parallel input for address signal 117.

A data input 118 for a data signal to be stored is connected via an inverter 119 to the input of a first tristate driver 120 and directly to the input of a second tristate driver 121. The first tristate driver 120 and the second tristate driver 121 are inhibited or opened by means of a state control signal provided at a respective inhibiting input. The state control signal is introduced into the switching element via a state control input 122 and likewise passed to the gate terminal of a first PMOS transistor 123 and to the gate terminal of a second PMOS transistor 124 and also to the control connection 125. A respective source terminal of the PMOS transistors 123, 124 is fed with an applied voltage $V_{DD}$ from a constant-voltage source 126.

A first data line 127 connects an output of the first tristate driver 120 to a drain terminal of the first PMOS transistor 123, to the first signal connection 105, 106 and to a first voltage input of a differential amplifier 129.

A second data line 128 connects an output of the second tristate driver 121 to a drain terminal of the second PMOS transistor 124, to the second signal connection 107, 108 and to a second voltage input of the differential amplifier 129.

An output data signal is provided at a voltage output 130 of the differential amplifier 129, and is passed to a signal input of a multiplexer 131. The multiplexer 131 has two signal outputs that are respectively connected to a data input of two registers 132, 133 set up as D-type flip-flops.

The output data signal provided at the signal input of the multiplexer 131 is switched in a manner dependent on activation signals input at the control input of the multiplexer 131. The control inputs are respectively connected to an access control signal output of the decoder 109.

The method of operation of the memory element illustrated in FIG. 1 is based on particular properties of MOSFET transistors. The latter are subject to a degradation of the saturation current in the course of their operation. The degradation is particularly pronounced if the electric current when writing to the memory element has a different direction or a different sign than the electric current which flows through the memory cell in reading out a stored datum. This phenomenon is connected with the asymmetrical damage of the transistor in the drain region thereof. The effect is additionally amplified by means of the series circuit of the transistors 110, 111, 112 and 113, 114, 115 in the first memory cell 103 and in the second memory cell 104, respectively, as illustrated in FIG. 1. In the present embodiment, each memory cell 103, 104 comprises three transistors 110, 111, 112 and 113, 114, 115, respectively. It is equally possible to use more or fewer transistors per memory cell 103, 104. The first memory cell 103 and the second memory cell 104 increase the sensitivity of the system. The data stored in the memory cells 103, 104 are evaluated differentially by means of the differential amplifier 129.

The cell selection lines are driven by the decoder 109, which, on the basis of an address information item of the address signal 117 sets an access control signal on one of the cell selection lines to the value logic "1", provided that the activation signal 116 likewise has a value logic "1". For a better understanding it is assumed below that the value logic "1" corresponds to a potential $V_{DD}$ and the value logic "0" corresponds to a zero potential.

A voltage pulse shall additionally be defined below for a simpler representation. In this case, a 0-1-0 pulse is a temporal pulse in which, on an electrical connection, firstly a zero potential is present, which is switched over to the voltage $V_{DD}$ during a specific time duration. Correspondingly, a 1-0-1 pulse on an electrical connection is an applied potential $V_{DD}$ which is switched over to a zero potential during a specific time duration. The time duration and thus the length of the pulse result from the effect respectively desired and may have a different length.

By virtue of the potential present on the cell selection line, there are present in a memory cell group 101, 102, at the gate terminals of the transistors 110, 111, 112 and 113, 114, 115, respectively, in each case such large electrical potentials that the charge carrier channels of the respective source-drain paths are open. A current can thus flow through them. The respective memory cell group 101, 102 is thus activated. At the same time, on account of the access control signal, the multiplexer 131 switches the signal path from the voltage output 130 to a register 132, 133 assigned to the memory cell group 101, 102.

In order to write to a memory cell group 101, 102, the latter is selected by means of the address signal 117. The data signal to be stored is provided at the data input 118. A switching state is established by the state control signal being set to the value logic "1". As a result, the first tristate driver 120 and second tristate driver 121 are activated and the first PMOS transistor 123 and the second PMOS transistor 123 are turned off. The data input 118 is thus connected to the first signal connection 105, 106 and the second signal connection 107, 108. The complement of the data signal to be stored is present at a first signal connection 105, 106, while the value of the data signal to be stored is present at the second signal connection 107, 108. The value logic "1" is present in the channel connection 125. In order to impress the datum to be stored into the memory cell group 101, 102 a 0-1-0 pulse is provided as activation signal 116. As a result, the memory cell group 101, 102 is activated and a current flows through the first memory cell 103 or through the second memory cell 104, which current degrades the saturation current of the transistors 110, 111, 112 or 113, 114, 115, respectively. The length of the 0-1-0 pulse of the activation signal 116 is chosen correspondingly in order to achieve a measurable degradation.

In order to read out a datum from a memory cell group 101, 102, the latter is likewise selected by means of the address signal 117. A read state is established by the state control signal being set to the value logic "0". As a result, the two tristate drivers 120, 121 are inhibited, while the first PMOS transistor 123 and second PMOS transistor 124 are open. The value logic "1" is present at the first signal connection 105, 106 and also at the second signal connection 107, 108, while the value logic "0" is present at the channel connection 125. If the activation signal then obtains a value logic "1", the gate terminals of the transistors 110, 111, 112 and 113, 114, 115 of the first memory cell 103 and of the second memory cell 104, respectively, in the selected memory cell group 101, 102 are open. A current can flow, limited by the saturation current. In accordance with the respective saturation current and the thereby afforded conductivity of the first memory cell 103 and of the second memory cell 104, the voltage is dropped across the first signal connection 105, 106 and the second signal connection 107, 108. A voltage difference between the first signal connection 105, 106 and the second signal connection 107, 108 is detected by means of the differential amplifier 129 and stored as a value in one of the registers 132, 133 via the multiplexer 131. As long as the registers 132, 133 are supplied with a supply voltage, the datum stored from the memory cell group 101, 102 can be provided by the register 132, 133.

Figure 2:
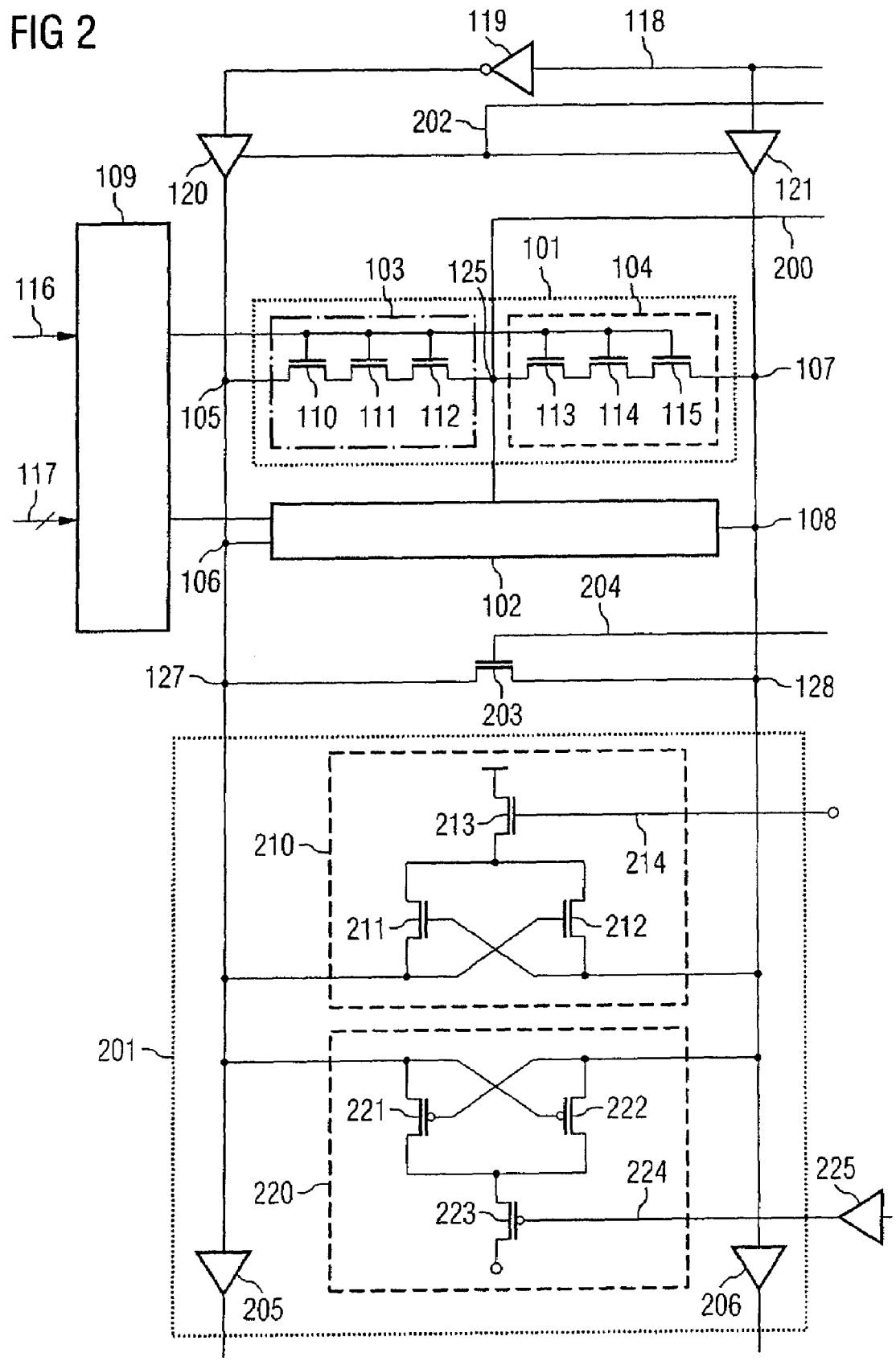
FIG. 2 shows a memory element in accordance with a second exemplary embodiment of the invention, in which the degradation of the saturation current of a transistor is utilized for storing data.

FIG. 2 illustrates a second embodiment of the memory element, which differs from FIG. 1 by the use of a read amplifier 201 (illustrated in dotted fashion). The memory cell groups 101, 102 are constructed as in FIG. 1 and are likewise activated via an access control output of a decoder 109. FIG. 2 likewise differs from FIG. 1 in that the tristate drivers 120, 121 are activated by a tristate control signal 202. By contrast, the control connection 125 is connected to a control input 200.

The first signal connection 105, 106 is connected to a line 127 of the read amplifier 201 and the second signal connection 107, 108 is connected to the second line 128 of the read amplifier 201. The potentials on the first line 127 and the second line 128 can be equalized by means of a transistor 203. For this purpose, the transistor 203 is switched or turned off via an equalization signal input 204.

Furthermore, the first line 127 and the second line 128 are coupled to one another via an NMOS latch 210 (illustrated in dashed fashion) and a PMOS latch 220 (illustrated in dashed fashion). The read amplifier 201 provides the stored datum and the complement with respect thereto at a first output 205 and at the second output 206, respectively.

The NMOS latch 210 has a feedback transistor stage comprising two NMOS transistors 211, 212. In this case, the gate terminal of a respective one of the NMOS transistors 211, 212 is connected to the source terminals of the respective other NMOS transistor 211, 212. The source terminal of one NMOS transistor 211 is connected to the first line 127, while the source terminal of the other NMOS transistor 212 is connected to the second line 128. The drain terminals of the two NMOS transistors 211, 212 are coupled to a switching transistor 213, which connects them through to a zero potential in a manner dependent on a voltage signal at a first supply input 214.

The PMOS latch 220 is constructed analogously from a feedback transistor stage comprising two PMOS transistors 221, 222. The source terminals thereof are coupled to a supply voltage $V_{DD}$ via the source-drain path of a further switching transistor 223. The further switching transistor 223 switches in a manner dependent on a voltage signal provided to it at a second supply input 224 by means of an inverter 225.

Figure 3:
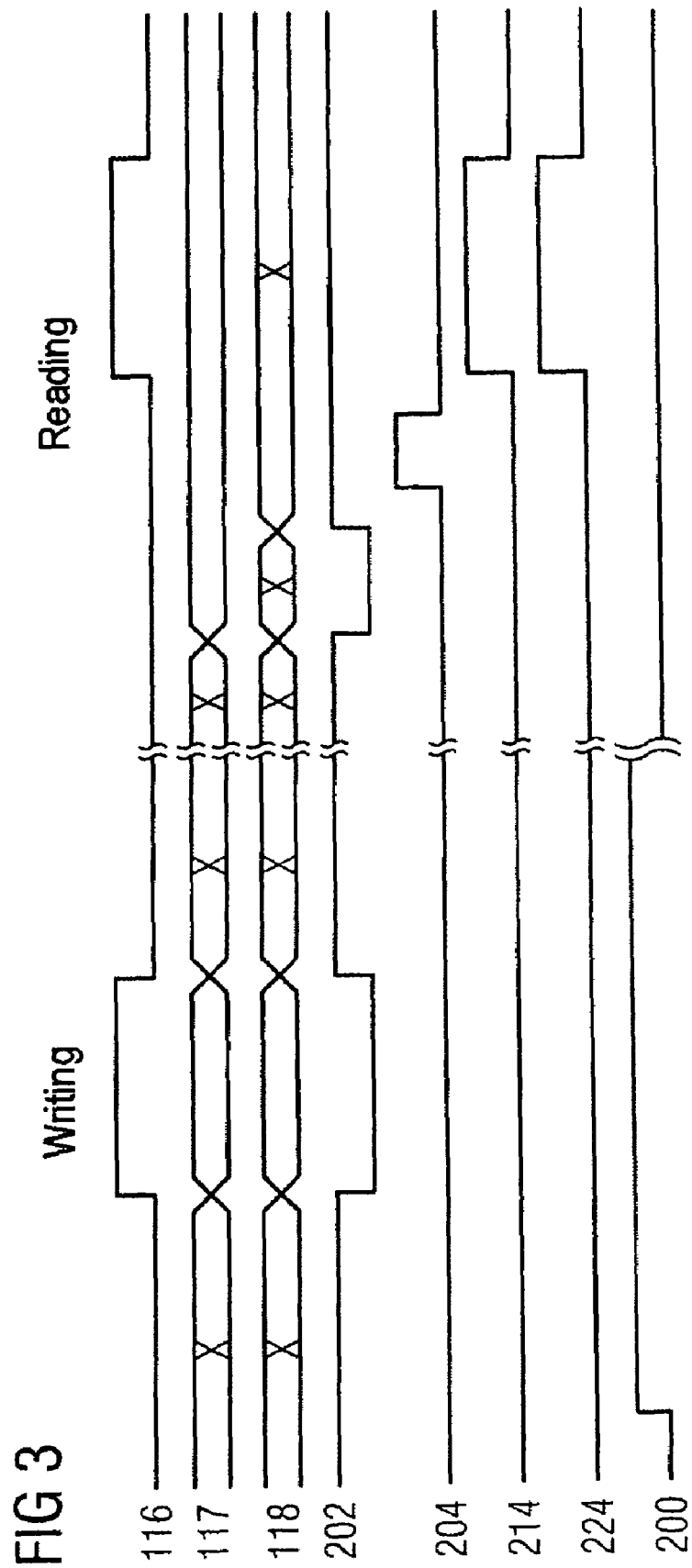
FIG. 3 shows the performance of a writing and reading operation in a memory element in accordance with FIG. 2.

FIG. 3 shows the performance of a writing and reading operation in a memory element in accordance with the embodiment in FIG. 2. During the writing operation, firstly the signal at the control input 200 is set to the value logic "1". The value logic "0" is present at the first supply input 214 and the second supply input 224 and also at the equalization signal input 204. The read amplifier 201 is thus not activated.

A memory cell group 101, 102 is written to by being selected by means of an address signal 117 and being activated by the activation signal 116 by means of a 0-1-0 pulse. At the same time, the tristate drivers 120, 121 are momentarily opened by a 1-0-1 pulse of the tristate control signal 202, so that a potential corresponding to the value of the datum present at the data input 118 and to its complement, respectively, is present at the first signal connection 105, 106 and at the second signal connection 107, 108.

During the writing operation, the datum and the complement thereof are impressed into the selected memory cell group 101, 102 by means of an irreversible change in the saturation currents of the transistors 110, 111, 112 and 113, 114, 115, respectively.

In order to read out the datum contained in a memory cell group 101, 102, the said datum is selected by means of the address signal 117. The potential at the control input 200 is set to the value logic "0". A potential having the value logic "0" is initially present at the first supply input 214 and the second supply input 224 as well as at the equalization signal input 204. An arbitrary signal having a valid value logic "0" or logic "1" is provided at the data input.

By means of a 1-0-1 pulse of the tristate control signal 202, the first line 127 and the second line 128 are occupied by a value 0 and 1, respectively, by a conductive connection to the data input being momentarily produced. The potentials of the first line 127 and the second line 128 are then equalized by means of a 0-1-0 pulse at the equalization signal input 204, so that a potential $V_{DD}/2$ is present on both.

Afterwards, the datum stored in the selected memory cell group 101, 102 is read out by a 0-1-0 pulse simultaneously being provided at the activation input 116 and also at the first supply input 214 and at the second supply input 224.

Figure 4:
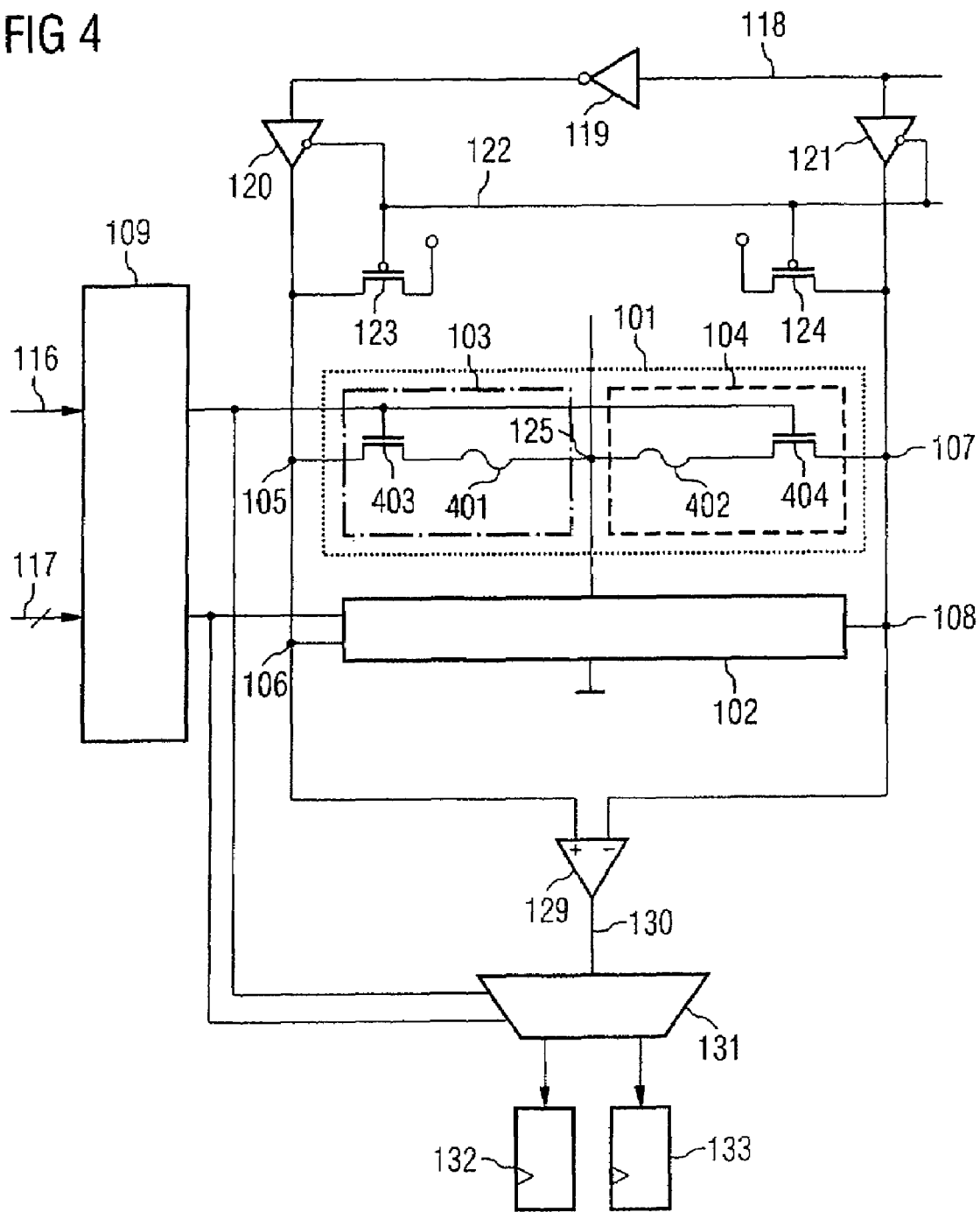
FIG. 4 shows a memory element in accordance with a third exemplary embodiment of the invention, which has severable fuses.

FIG. 4 shows the circuit construction of a memory element having severable fuses. The circuit differs from FIG. 1 in a different embodiment of the first memory cells 103 and of the second memory cell 104 and also in that the control connection 125 is set to a zero potential.

The first memory cell 103 and the second memory cell 104 respectively comprise an activation transistor 403, 404, the source-drain path of which couples the first and second signal connection 105, 106, 107, 108, respectively, to a thin interconnect (fuse) 401, 402. The gate terminals of the activation transistors 403, 404 are connected to the access control output of the decoder 109.

A writing and reading operation is effected in accordance with the sequence described in FIG. 1. A current flowing through the thin interconnect 401, 402 destroys the latter and thus its conductivity. A possible healing of the severing of the thin interconnect 401, 402 is insignificant due to the differential construction of the memory element, since the datum stored in the memory element is determined from the comparison of the first partial-datum with the second partial datum.

LIST OF NUMERALS 101,102 Memory cell group
103 First memory cell
104 Second memory cell
105,106 First signal connection
107,108 Second signal connection 110,111,112 Transistor
113,114,115 Transistor
109 Decoder
116 Activation signal
117 Address signal
118 Data input
119 Inverter
120 First tristate driver
121 Second tristate driver
122 State control input
123 First PMOS transistor
124 Second PMOS transistor
125 Control connection
126 Constant-voltage source
127 First data line
128 Second data line
129 Differential amplifier
130 Voltage output
131 Multiplexer
132,133 Register
200 Control input
201 Sense amplifier
202 Tristate control signal
203 Transistor
204 Equalization control input
205 First output
206 Second output
210 NMOS latch
211,212 NMOS transistor
213 Switching transistor
214 First supply input
220 PMOS latch
221,222 PMOS transistor
223 Switching transistor
224 Second supply input
225 Inverter
401,402 Thin interconnect
403,404 Activation transistor

What is claimed is:

1. A non-volatile memory element for storing at least one datum comprising:
   at least one first memory cell to which and from which a first partial datum is written and read out and which has a first characteristic that can be altered electrically irreversibly in a manner dependent on the first partial datum,
   at least one second memory cell to which and from which a second partial datum different from said first partial datum is written and read out and which has a second characteristic that can be altered electrically irreversibly in a manner dependent on the second partial datum, and
   a read device coupled to the first memory cell and the second memory cell, wherein the memory element is being set up in such a way that the first partial datum and the second partial datum are represented by a difference in the characteristics of the first and second memory cells which depends on the datum, and the read device being set up in such a way that it determines the stored datum from the difference of the first partial datum and the second partial datum,
   wherein the first memory cell and/or the second memory cell each comprise a transistor and the first and/or second characteristic is/are the saturation current of a source-drain path of the transistor.

2. A memory element according to claim 1, wherein the second partial datum being the complementary value of the first partial datum.

3. A memory element according to claim 2, wherein the read device comprises a differential amplifier for determining the datum from the first partial datum and the second partial datum.

4. A memory element according to claim 1, wherein the first memory cell and/or the second memory cell each comprise a resistance element, and the first and/or second characteristic is/are the electrical conductivity of the resistance element.

5. A memory element according to claim 4, wherein the resistance element is an electrically severable interconnect.

6. A memory element according to claim 1, comprising a register coupled to the read device and serving for storing the datum determined by the read device.

7. A memory element according to claim 1, wherein the first memory cell and/or the second memory cell comprise a switching element, which prevents or permits an electric current flow through the first memory cell in a manner dependent on an activation signal fed to the switching element.

8. A memory element arrangement comprising a multiplicity of non-volatile memory elements according to claim 1, and comprising a selection device coupled to the multiplicity of non-volatile memory elements, wherein the selection device is set up in such a way that a datum can selectively be stored in a memory element selected from the multiplicity of memory elements or be read out from the said memory element.

9. A memory element arrangement according to claim 8, wherein the multiplicity of memory elements comprise a common read device.

10. A non-volatile memory element for storing data comprising a first memory cell for storing a first partial data and comprising an electrically irreversibly alterable first characteristic dependent on the first partial data, a second memory cell for storing a second partial data comprising an electrically irreversibly alterable second characteristic dependent on the second partial data, and a read device coupled to the first memory cell and the second memory cell, wherein the memory element is operable to determine the first partial data and the second partial data in a manner dependent on the data, and the read device is operable to determine the stored data from a comparison of the first partial data with the second partial data, wherein the first memory cell and/or the second memory cell each comprise a transistor and the first and/or second characteristic is/are the saturation current of a source-drain path of the transistor.

11. A memory element according to claim 10, wherein the second partial data being the complementary value of the first partial data, and the read device is operable to determine the data stored in the memory element from the difference between the first partial data and the second partial data.

12. A memory element according to claim 11, wherein the read device comprises a differential amplifier for determining the data from the first partial data and the second partial data.

13. A memory element according to claim 10, wherein the first memory cell and/or the second memory cell each comprise a resistance element, and the first and/or second characteristic is/are the electrical conductivity of the resistance element.

14. A memory element according to claim 13, wherein the resistance element is an electrically severable interconnect.

15. A memory element according to claim 10, comprising a register coupled to the read device and serving for storing the data determined by the read device.

16. A memory element according to claim 10, wherein the first memory cell and/or the second memory cell comprise a switching element, which prevents or permits an electric current flow through the first memory cell in a manner dependent on an activation signal fed to the switching element.

17. A memory element arrangement comprising a multiplicity of non-volatile memory elements according to claim 10, and comprising a selection device coupled to the multiplicity of non-volatile memory elements, wherein the selection device is operable to store a data selectively in a memory element selected from the multiplicity of memory elements or to read from the said memory element.

18. A memory element arrangement according to claim 17, wherein the multiplicity of memory elements comprise a common read device.

19. A non-volatile memory element for storing at least one datum comprising:

at least one first memory cell comprising a first transistor, wherein a first saturation current of a source-drain path of the first transistor is changed electrically irreversibly in a manner dependent on a first partial datum, at least one second memory cell comprising a second transistor, wherein a second saturation current of a source-drain path of the second transistor is changed electrically irreversibly in a manner dependent on a second partial datum, and a read device coupled to the first memory cell and the second memory cell, wherein the memory element is being set up in such a way that the first partial datum and the second partial datum are represented by a difference in the first and second saturation currents which depends on the datum, and the read device being set up in such a way that it determines the stored datum from the difference of the first and second saturation currents.

* * * * *